(12) United States Patent
Lee et al.

(10) Patent No.: US 7,902,930 B2
(45) Date of Patent: Mar. 8, 2011

(54) COLPITTS QUADRATURE VOLTAGE CONTROLLED OSCILLATOR

(75) Inventors: Ja Yol Lee, Daejeon (KR); Sang Heung Lee, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 101 days.

(21) Appl. No.: 11/927,957

(22) Filed: Oct. 30, 2007

(65) Prior Publication Data
US 2008/0129392 A1  Jun. 5, 2008

(30) Foreign Application Priority Data

Dec. 5, 2006  (KR) .................. 10-2006-0122523
Jun. 13, 2007  (KR) .................. 10-2007-0057596

(51) Int. Cl.
*H03K 3/03* (2006.01)
(52) U.S. Cl. ............... 331/46; 331/2; 331/45; 331/50; 331/117 R; 331/117 FE; 331/135; 331/167
(58) Field of Classification Search .......... 331/45, 331/46, 48, 50, 117 R, 117 FE, 135, 167; 327/2, 7, 8, 12
See application file for complete search history.

(56) References Cited

U.S. PATENT DOCUMENTS

| 5,982,243 | A | 11/1999 | Pope | |
|---|---|---|---|---|
| 6,429,748 | B2 * | 8/2002 | Nicholls et al. | 331/56 |
| 6,707,344 | B2 * | 3/2004 | Cargill et al. | 331/74 |
| 6,987,425 | B1 * | 1/2006 | Sutardja | 331/117 R |
| 7,026,880 | B2 | 4/2006 | Shi et al. | |
| 7,075,377 | B2 | 7/2006 | Metaxakis et al. | |
| 7,239,209 | B2 * | 7/2007 | Adan | 331/117 R |
| 7,414,481 | B2 * | 8/2008 | Li et al. | 330/311 |
| 2006/0006954 | A1 | 1/2006 | Sanduleanu | |
| 2006/0097801 | A1 | 5/2006 | Adan | |
| 2006/0181356 | A1 * | 8/2006 | Park et al. | 331/45 |
| 2006/0208818 | A1 * | 9/2006 | Lee et al. | 331/167 |
| 2006/0226923 | A1 * | 10/2006 | Veenstra et al. | 331/167 |
| 2007/0247242 | A1 * | 10/2007 | Kim et al. | 331/1 A |

(Continued)

FOREIGN PATENT DOCUMENTS

JP  2000-286724  10/2000

(Continued)

OTHER PUBLICATIONS

Leonard Dauphinee et al, A Balanced 1.5GHz Voltage Controlled Oscillator with an Integrated LC Resonator, 1997 IEEE International Solid-State Circuits Conference, pp. 390, pp. 391 and pp. 491.

(Continued)

*Primary Examiner* — Arnold Kinkead
*Assistant Examiner* — Richard Tan
(74) *Attorney, Agent, or Firm* — Rabin & Berdo, PC

(57) ABSTRACT

Provided is a colpitts quadrature voltage controlled oscillator capable of obtaining quadrature orthogonal signals using a quadrature combination between a base and a collector of each transistor, without using an additional circuit such as a coupled transistor, a coupled transformer, a multiphase RC filter, etc. Accordingly, since nonlinearity, increased phase noise, a decrease in the Q-factor of an LC resonator, and increased power consumption can be avoided, a colpitts quadrature voltage controlled oscillator that has low phase noise, low electric power consumption, and a compact size can be implemented.

6 Claims, 8 Drawing Sheets

U.S. PATENT DOCUMENTS

2008/0129392 A1* 6/2008 Lee et al. .................. 331/46

FOREIGN PATENT DOCUMENTS

| JP | 2004-072520 | 3/2004 |
| KR | 1020020067121 A | 8/2002 |
| KR | 2003-0070576 | 8/2003 |
| KR | 2005-0081545 | 8/2005 |
| KR | 1020050119426 A | 12/2005 |
| KR | 1020060091192 A | 8/2006 |
| KR | 1020060107031 A | 10/2006 |

OTHER PUBLICATIONS

Yodprasit et al., Realization of a Low-Voltage and Low-Power Colpitts Quadrature Oscillator, 2006 IEEE, ISCAS 2006, pp. 4289-4292.

* cited by examiner

COLPITTS QUADRATURE VOLTAGE CONTROLLED OSCILLATOR

CROSS-REFERENCE TO RELATED APPLICATION

This application claims priority to and the benefit of Korean Patent Application No. 2006-122523, filed Dec. 5, 2006, and No. 2007-57596, filed Jun. 13, 2007, the disclosure of which is incorporated herein by reference in its entirety.

BACKGROUND

1. Field of the Invention

The present invention relates to a colpitts quadrature voltage controlled oscillator, and more particularly, to a colpitts quadrature voltage controlled oscillator that is capable of obtaining a precise quadrature orthogonal signal without using a separate coupled device or a passive/active device, has low phase noise, consumes less electric power, and is compact in size.

2. Discussion of Related Art

Currently, telecommunication transceiver systems are switching from a super-heterodyne architecture to a direct conversion architecture, which has several advantages in terms of circuit structure, power consumption, and cost.

In a direct conversion transceiver, orthogonal signals having the same amplitude and having phases delayed by 90 degrees are required for signal conversion. Such orthogonal signals are generated using a colpitts quadrature voltage controlled oscillator.

FIG. 1a is a circuit diagram of a conventional colpitts differential voltage controlled oscillator 100. The voltage controlled oscillator 100 of FIG. 1a is a capacitance-feedback common-collector colpitts differential voltage controlled oscillator and has a balanced structure that generates signals that are 180 degrees out of phase.

As illustrated in FIG. 1a, the conventional colpitts differential voltage controlled oscillator 100 includes a first LC resonator 101 connected to a power supply voltage $V_{cc}$ and generating a resonance frequency, first and second oscillators 102 and 103 including first and second oscillation transistors $Q_1$ and $Q_2$ that oscillate at the resonance frequency to output an oscillation signal, feedback capacitors $C_f$ and a degeneration capacitor $C_e$ connected between the first and second oscillation transistors $Q_1$ and $Q_2$, and current sources $I_s$.

In the first oscillator 102 and the second oscillator 103, the feedback capacitors $C_f$ are respectively connected between bases and emitters of the first and second oscillation transistors $Q_1$ and $Q_2$, and the degeneration capacitor $C_e$ is connected between the emitter of the first oscillation transistor $Q_1$ and the emitter of the second oscillation transistor $Q_2$. The current sources $I_s$ are respectively connected between the emitters and ground of the first and second oscillation transistors $Q_1$ and $Q_2$ and the power supply voltage $V_{cc}$ is connected to collectors of the first and second oscillation transistors $Q_1$ and $Q_2$.

A first output node I+ of the first LC resonator 101 is connected to the base of the first oscillation transistor $Q_1$, a second output node I− is connected to the base of the second oscillation transistor $Q_2$ to form a differential oscillator structure, and differential signals that are 180 degrees out of phase are generated from the first output node I+ and the second output node I−.

Briefly describing operation of the colpitts voltage controlled oscillator 100, first, values of the feedback capacitors $C_f$ and the degeneration capacitor $C_e$ are adjusted to generate a negative resistance. Here, the negative resistance may be generated in a desired frequency band by adjusting the values of the feedback capacitors $C_f$ and the degeneration capacitor $C_e$.

As described above, the values of the feedback capacitors $C_f$ and the degeneration capacitor $C_e$ are adjusted to generate the negative resistance in the desired frequency band, so that the first LC resonator 101 can resonate at a desired frequency.

The resonance frequency generated by the first LC resonator 101 is input to the bases of the first and second oscillation transistors $Q_1$ and $Q_2$ to cause oscillation.

FIG. 1b illustrates a differential signal generated by the colpitts differential voltage controlled oscillator 100 of FIG. 1a. As illustrated in FIG. 1b, differential signals that are 180 degrees out of phase are generated from the first output node I+ and the second output node I− of the first LC resonator 101.

While quadrature orthogonal signals having the same amplitude and having phases delayed by 90 degrees are required in the direct conversion transceiver, according to the conventional colpitts differential voltage controlled oscillator 100, only differential signals that are 180 degrees out of phase are obtained, as illustrated in FIG. 1b. The following three (3) methods of obtaining quadrature orthogonal signals have been disclosed.

A first method involves using a coupled transistor or a coupled transformer to combine two voltage controlled oscillators so that a quadrature orthogonal signal is obtained. However, this method results in unnecessary nonlinearity, increased phase noise, decrease in the Q-factor of an LC resonator, and increased power consumption due to the coupled transistor or the coupled transformer.

A second method involves connecting a frequency divider to the rear end of a differential voltage controlled oscillator. In this case, a differential voltage controlled oscillator that runs at twice the desired frequency is required, which results in increased phase noise and electric power consumption.

A third method involves connecting a multiphase RC filter to the rear end of a differential voltage controlled oscillator. In this case, it is difficult to obtain a precise orthogonal signal, and thus a separate phase calibration circuit is required. Consequently, the oscillator circuit becomes complex and electric power consumption increases.

SUMMARY OF THE INVENTION

The present invention is directed to a colpitts quadrature voltage controlled oscillator that is capable of obtaining a precise quadrature orthogonal signal without using a separate coupled device or a passive/active device, has low phase noise characteristics, consumes less electric power, and is compact in size.

One aspect of the present invention provides a colpitts quadrature voltage controlled oscillator comprising: first and second LC resonators connected to a power supply voltage and generating a resonance frequency; first and second differential oscillators comprising first and second oscillation transistors that oscillate at the generated resonance frequency to output an oscillation signal; and feedback capacitors and a degeneration capacitor connected between the first and second oscillation transistors, wherein first and second output nodes of the first LC resonator are respectively connected to bases of the first and second oscillation transistors, and third and fourth output nodes of the second LC resonators are respectively connected to collectors of the first and second oscillation transistors, so that quadrature orthogonal signals having a phase difference of 90 degrees are generated from the bases and collectors of the first and second oscillation transistors.

BRIEF DESCRIPTION OF THE DRAWINGS

The above and other objects, features and advantages of the present invention will become more apparent to those of ordinary skill in the art by describing in detail exemplary embodiments thereof with reference to the attached drawings in which:

FIG. 1b illustrates an differential signal generated from the colpitts differential voltage controlled oscillator of FIG. 1a.

FIG. 2b illustrates an orthogonal signal generated from the colpitts quadrature voltage controlled oscillator of FIG. 2a.

FIG. 3b illustrates an orthogonal signal generated from the colpitts quadrature voltage controlled oscillator of FIG. 3a.

FIG. 4b illustrates an orthogonal signal generated from the colpitts quadrature voltage controlled oscillator of FIG. 4a, and FIG. 4c illustrates a frequency spectrum of the orthogonal signal generated from the colpitts quadrature voltage controlled oscillator of FIG. 4a.

DETAILED DESCRIPTION OF EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the exemplary embodiments set forth herein.

Before describing the present invention, a colpitts quadrature voltage controlled oscillator includes two or four transistors, each of which may be a bipolar transistor (BJT) including a collector, a base, and an emitter, or a field effect transistor (FET) including a drain, a gate and a source. Here, in the bipolar transistor, the magnitude and direction of a current flowing from the collector to the emitter depend on the magnitude and polarity of a current applied between the base and the emitter. Also, in the field effect transistor, the magnitude and direction of a current flowing from the drain to the source depend on the magnitude and polarity of a voltage applied between the gate and the source.

While a bipolar transistor is used in the voltage controlled oscillators of the following exemplary embodiments, this invention may be embodied using a field effect transistor or another type of transistor and therefore should not be construed as limited to the exemplary embodiments set forth herein.

First Exemplary Embodiment

Figure 2A:
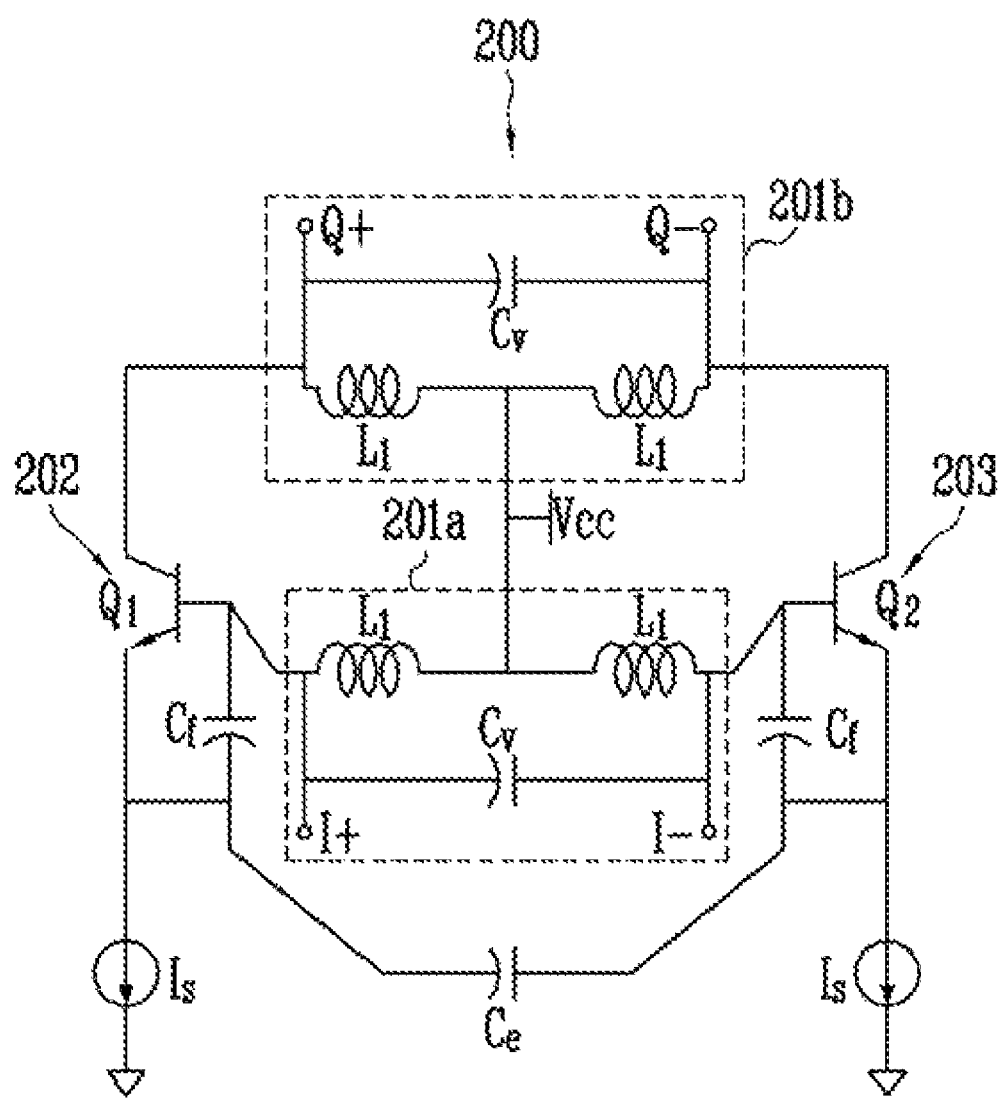
FIG. 2a is a circuit diagram of a colpitts quadrature voltage controlled oscillator according to a first exemplary embodiment of the present invention.

FIG. 2a is a circuit diagram of a colpitts quadrature voltage controlled oscillator 200 according to a first exemplary embodiment of the present invention.

Figure 1A:
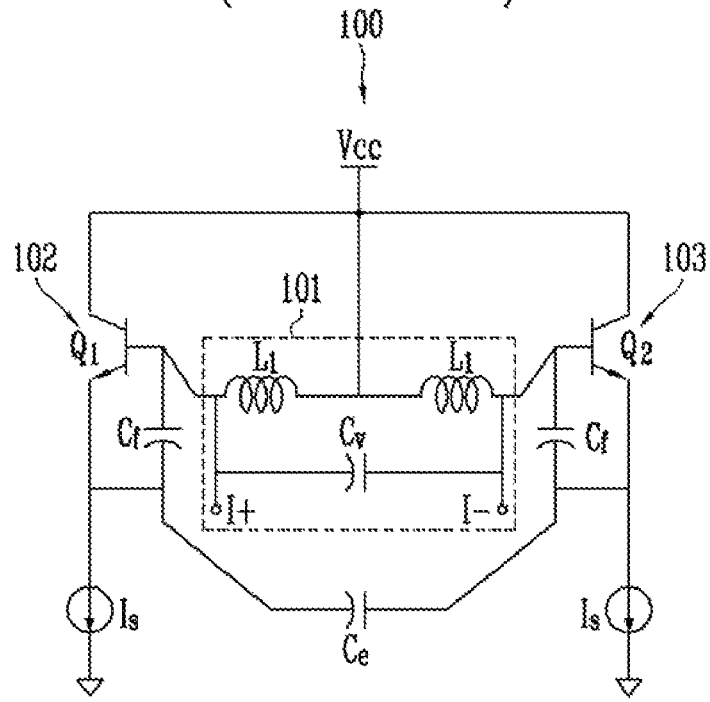
FIG. 1a is a circuit diagram of a conventional colpitts differential voltage controlled oscillator.
Figure 1B:
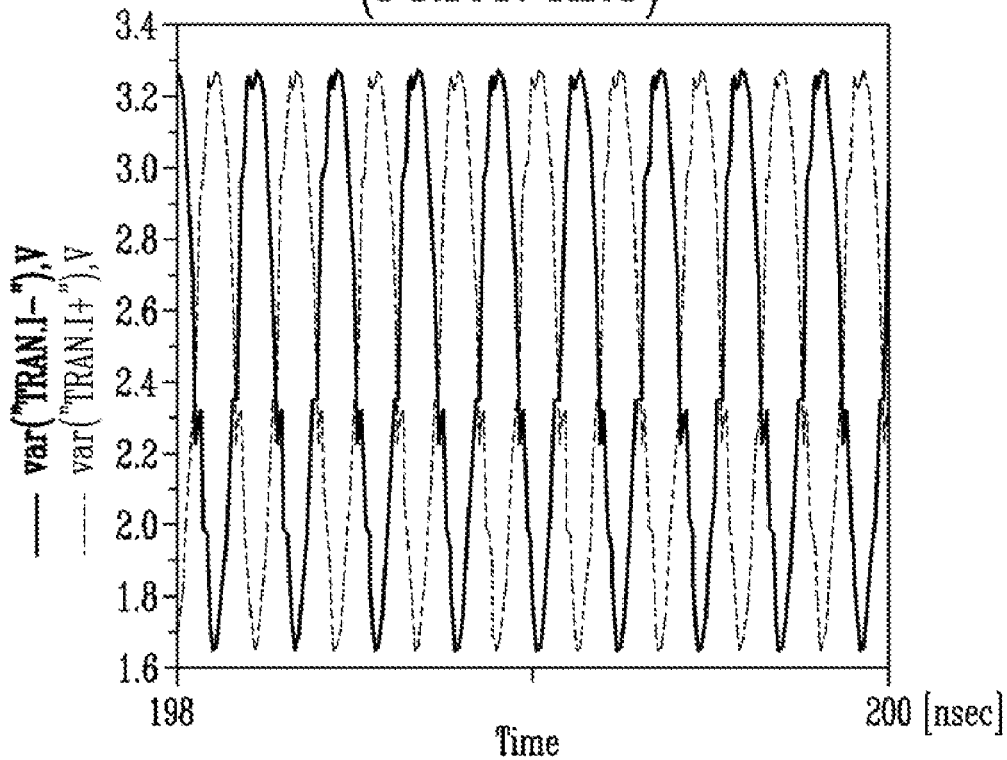

As illustrated in FIG. 2a, the colpitts quadrature voltage controlled oscillator 200 of the present invention has a structure in which collectors of the first and second oscillation transistors $Q_1$ and $Q_2$ of the differential common collector colpitts voltage controlled oscillator 100 of FIG. 1a are connected to a second LC resonator 201b. The colpitts quadrature voltage controlled oscillator 200 includes first and second LC resonators 201a and 201b connected to a power supply voltage $V_{cc}$ and generating a resonance frequency, first and second differential oscillators 202 and 203 including first and second oscillation transistors $Q_1$ and $Q_2$ that oscillate at the generated resonance frequency to output an oscillation signal, feedback capacitors $C_f$ and a degeneration capacitor $C_e$ connected between the first and second oscillation transistors $Q_1$ and $Q_2$, and current sources $I_s$.

In the colpitts quadrature voltage controlled oscillator 200 of the present invention, quadrature orthogonal signals are generated from collector and base terminals of the first and second oscillation transistors $Q_1$ and $Q_2$ of the first and second differential oscillators 202 and 203. In the colpitts quadrature voltage controlled oscillator, the characteristic that the bases and the collectors of the first and second oscillation transistors $Q_1$ and $Q_2$ are 90 degrees out of phase is employed. As a result, orthogonal signals can be obtained without a separate coupled transistor or transformer.

That is, a coupled device or a passive/active device is inevitably used to obtain orthogonal signals in the conventional voltage controlled oscillator, which results in unnecessary nonlinearity, increased phase noise, a decrease in the Q-factor of an LC resonator, and increased consumption of electric power. However, in the present invention, a quadrature combination between the bases and the collectors of the first and second oscillation transistors $Q_1$ and $Q_2$ is employed to obtain the quadrature orthogonal signals and thus avoid problems resulting from the coupled device or the passive/active device.

In the first and second differential oscillators 202 and 203, the feedback capacitors $C_f$ are respectively connected between bases and emitters of the first and second oscillation transistors $Q_1$ and $Q_2$, and the degeneration capacitor $C_e$ is connected between the emitter of the first oscillation transistor $Q_1$ and the emitter of the second oscillation transistor $Q_2$.

The current sources $I_s$ are respectively connected between the emitters and ground of the first and second oscillation transistors $Q_1$ and $Q_2$, the collectors of the first and second oscillation transistors $Q_1$ and $Q_2$ are respectively connected to a third output node Q+ and a fourth output node Q− of the second LC resonator 201b, and the bases of the first and second oscillation transistors $Q_1$ and $Q_2$ are respectively connected to a first output node I+ and a second output node I− of the first LC resonator 201a.

The first and second LC resonators 201a and 201b are connected to each other through the power supply voltage $V_{cc}$, and two identical inductors $L_1$ are connected to each other at one end and to both ends of a varactor capacitor $C_v$ at the other end to form an LC resonant circuit.

The first output node I+ of the first LC resonator 201a is connected to the base of the first oscillation transistor $Q_1$, and the second output node I− is connected to the base of the second oscillation transistor $Q_2$. Also, the third output node Q+ of the second LC resonator 201b is connected to the collector of the oscillation transistor $Q_1$, and the fourth output node Q− is connected to the collector of the second oscillation transistor $Q_2$ to form a quadrature oscillator structure.

Briefly describing operation of the colpitts quadrature voltage controlled oscillator 200, first, values of the feedback capacitors $C_f$ and the degeneration capacitor $C_e$ are adjusted to generate a negative resistance in a desired frequency band so that the first LC resonator 201a resonates at a desired frequency.

Here, a ratio of the feedback capacitor $C_f$ to the degeneration capacitor $C_e$ determines tank voltage of the first and second LC resonators 201a and 201b. When the ratio of the feedback capacitor $C_f$ to the degeneration capacitor $C_e$ is large, loads of the first and second oscillation transistors $Q_1$ and $Q_2$ are reduced to produce a higher tank voltage, so that phase noise can be further reduced.

Similarly, the resonance frequency generated by the first LC resonator 201a is input into the bases of the first and second oscillation transistors $Q_1$ and $Q_2$ of the first and second differential oscillators 202 and 203, thereby causing oscillation.

Accordingly, differential oscillation signals generated from each base terminal of the first and second oscillation transistors $Q_1$ and $Q_2$ are 90 degrees out of phase at the collector terminals. Thus, quadrature orthogonal signals that are 90 degrees out of phase can be obtained from the first to fourth output nodes I+, I−, Q+ and Q− of the first and second LC resonators 201a and 201b.

Figure 2B:
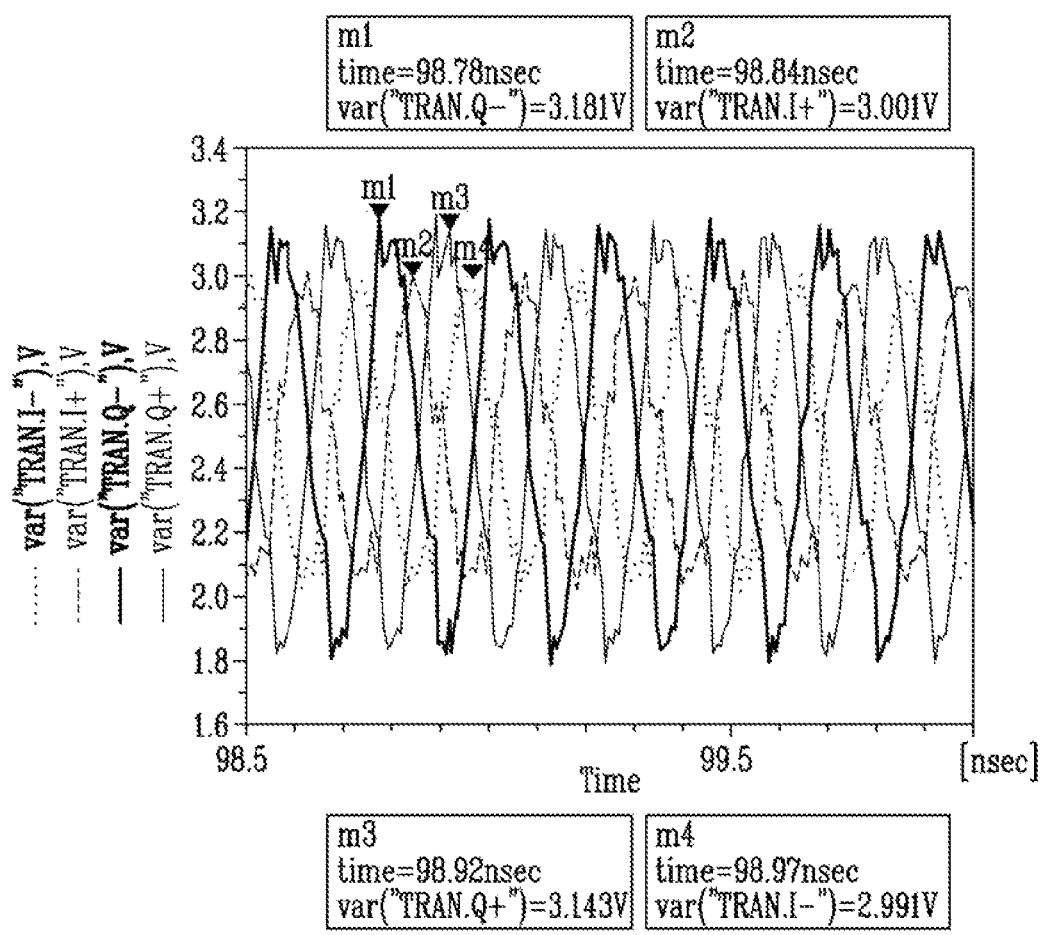

FIG. 2b illustrates an orthogonal signal generated by the colpitts quadrature voltage controlled oscillator 200 of FIG. 2a. As illustrated in FIG. 2b, quadrature orthogonal signals are generated from the first and second output nodes I+ and I− of the first LC resonator 201a and the third and fourth output nodes Q+ and Q− of the second LC resonator 201b.

However, the orthogonal signals output from the first and second output nodes I+ and I− of the first LC resonator 201a have smaller amplitudes than those output from the third and fourth output nodes Q+ and Q− of the second LC resonator 201b. This is because voltage swing and DC bias voltage of the collectors of the first and second oscillation transistors $Q_1$ and $Q_2$ are larger and higher than those of the bases. A method of solving this problem will be described in more detail with reference to the following second exemplary embodiment.

Second Exemplary Embodiment

Figure 3A:
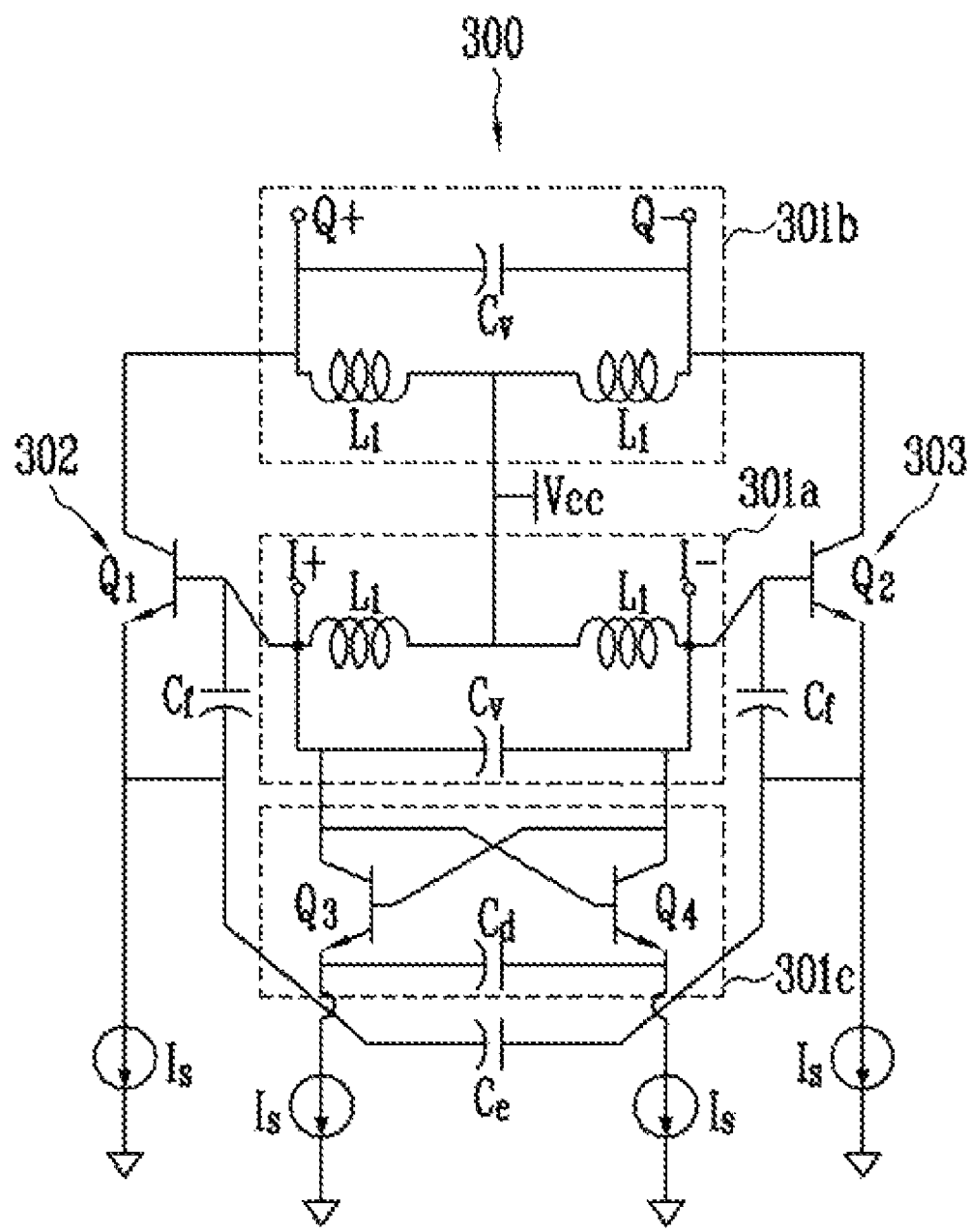
FIG. 3a is a circuit diagram of a colpitts quadrature voltage controlled oscillator according to a second exemplary embodiment of the present invention.

FIG. 3a is a circuit diagram of a colpitts quadrature voltage controlled oscillator 300 according to a second exemplary embodiment of the present invention.

As illustrated in FIG. 3a, the colpitts quadrature voltage controlled oscillator 300 of the present invention has a structure in which the first LC resonator 201a of the colpitts quadrature voltage controlled oscillator 200 of FIG. 2a is combined with a negative resistance cell 301c. The colpitts quadrature voltage controlled oscillator 300 includes first and second LC resonators 301a and 301b connected to a power supply voltage $V_{cc}$ and generating a resonance frequency, the negative resistance cell 301c connected to the first LC resonator 301a, first and second differential oscillators 302 and 303 including first and second oscillation transistors $Q_1$ and $Q_2$ that oscillate at the generated resonance frequency to output an oscillation signal, feedback capacitors $C_f$ and a degeneration capacitor $C_e$ connected between the first and second oscillation transistors $Q_1$ and $Q_2$ and current sources $I_s$.

In the voltage controlled oscillator 200 of FIG. 2a, the orthogonal signals from the first and second output nodes I+ and I− of the first LC resonator 201a are smaller than those of the third and fourth output nodes Q+ and Q− of the second LC resonator 201b, and thus the quadrature orthogonal signals do not have uniform amplitudes and are not precisely 90 degrees out of phase. To solve this problem, the negative resistance cell 301c is cross-connected to the first output node I+ and the second output node I− of the first LC resonator 301a as illustrated in FIG. 3a.

Briefly describing the connection of the negative resistance cell 301c, a collector of a third transistor $Q_3$ is connected to a base of a fourth transistor $Q_4$, a base of the third transistor $Q_3$ is connected to a collector of the fourth transistor $Q_4$, a capacitor $C_d$ is connected between emitters of the third and fourth transistors $Q_3$ and $Q_4$, and the current sources $I_s$ are respectively connected between the emitters and ground of the third and fourth transistors $Q_3$ and $Q_4$.

Further, the first output node I+ of the first LC resonator 301a is connected to both a base of the first transistor $Q_1$ of the first differential oscillator 302 and a collector of the third transistor $Q_3$ of the negative resistance cell 301c, and the second output node I− is connected to both a base of the second oscillation transistor Q2 of the second differential oscillator 303 and a collector of the fourth transistor $Q_4$ of the negative resistance cell 301c.

Briefly describing operation of the colpitts quadrature voltage controlled oscillator 300 having the above configuration, first, values of the feedback capacitors $C_f$ and the degeneration capacitor $C_e$ are adjusted to generate a negative resistance in a desired frequency band, so that the first LC resonator 301a can resonate at a desired frequency.

The resonance frequency generated by the first LC resonator 301a is input to the bases of the first and second oscillation transistors $Q_1$ and $Q_2$ of the first and second differential oscillators 302 and 303 to induce oscillation.

Here, since amplitudes of the orthogonal signals output from the bases of the first oscillation transistor $Q_1$ and the second oscillation transistor $Q_2$ are increased by voltage swing widths of the collectors of the third and fourth transistors $Q_3$ and $Q_4$ of the negative resistance cell 301c, the amplitudes of the orthogonal signals output from the bases of the first and second oscillation transistors $Q_1$ and $Q_2$ become the same as those output from the collectors of the first and second oscillation transistors $Q_1$ and $Q_2$. That is, the amplitudes of the orthogonal signals of the first and second output nodes I+ and I− of the first LC resonator 301a are increased by the third and fourth oscillation transistors $Q_3$ and $Q_4$, so that they become the same as those of the third and fourth output nodes Q+ and Q− of the second LC resonator 301b.

Accordingly, quadrature orthogonal signals that have the same amplitude and are 90 degrees out of phase are respectively output from the first to fourth output nodes I+, I−, Q+ and Q−, which are respectively connected to the base and collector terminals of the first and second oscillation transistors $Q_1$ and $Q_2$ by the negative resistance cell 301c.

Figure 3B:
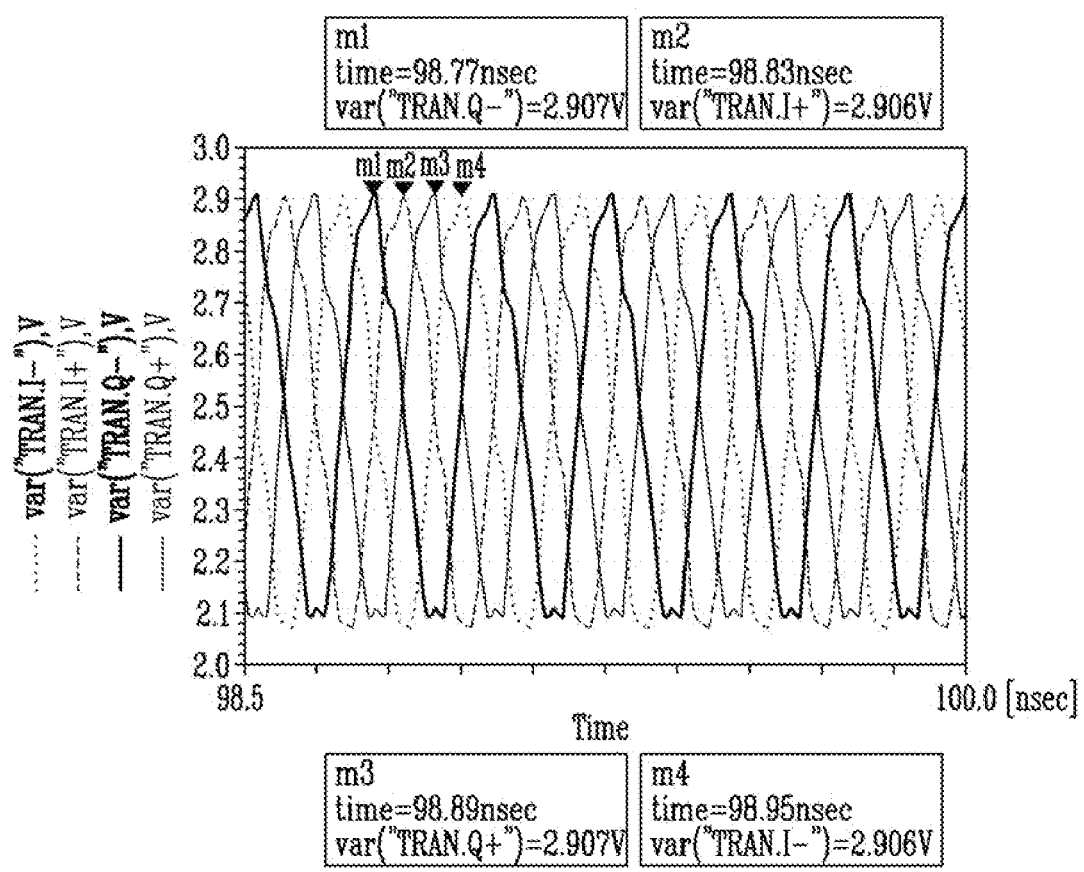

FIG. 3b illustrates an orthogonal signal generated from the colpitts quadrature voltage controlled oscillator 300 of FIG. 3a. As illustrated in FIG. 3b, orthogonal signals that have the same amplitude and are precisely 90 degrees out of phase are generated from the first and second output nodes I+ and I− of the first LC resonator 301a and the third and fourth output nodes Q+ and Q− of the second LC resonator 301b.

Third Exemplary Embodiment

Figure 4A:
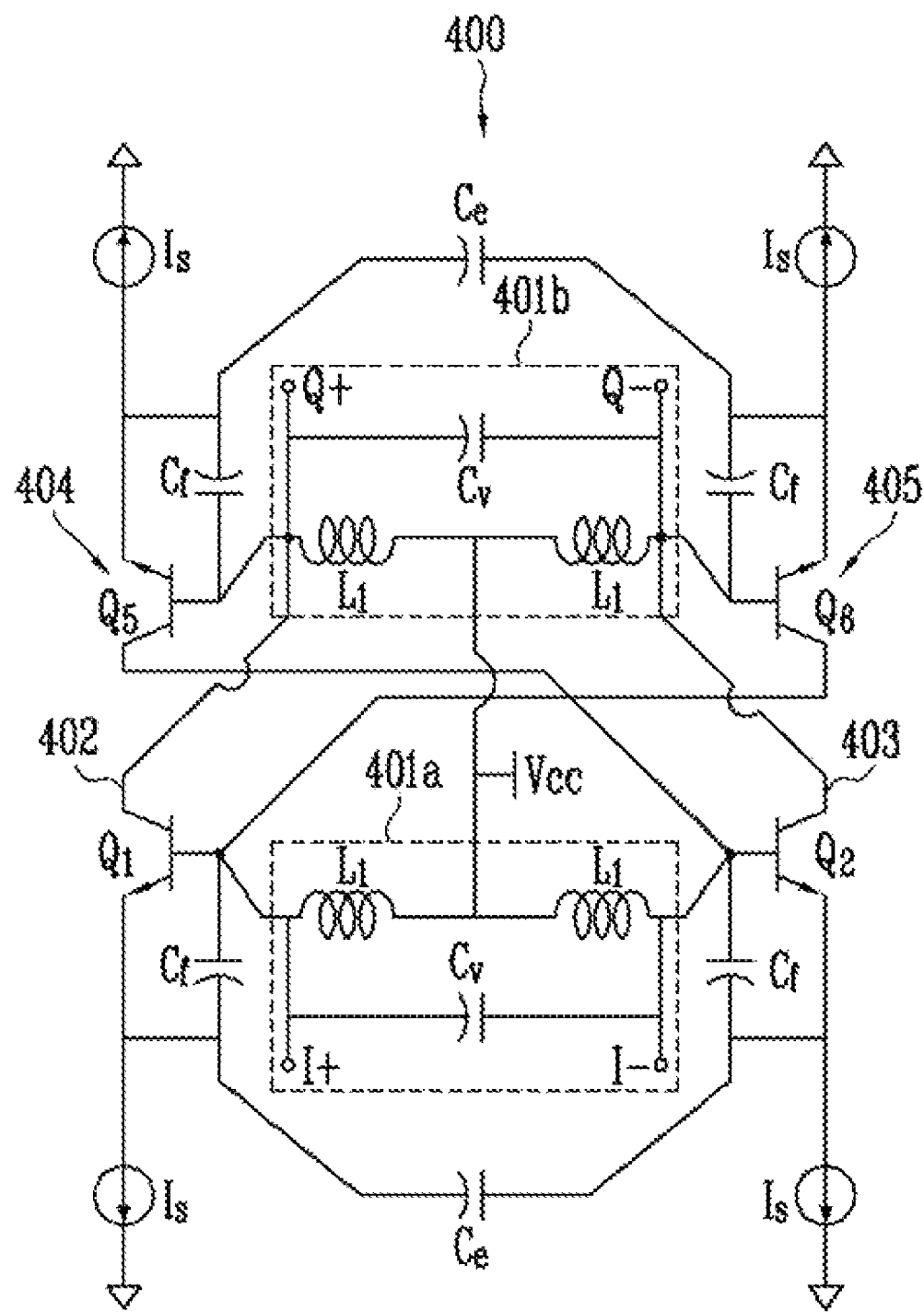
FIG. 4a is a circuit diagram of a colpitts quadrature voltage controlled oscillator according to a third exemplary embodiment of the present invention.

FIG. 4a is a circuit diagram of a colpitts quadrature voltage controlled oscillator 400 according to a third exemplary embodiment of the present invention.

As illustrated in FIG. 4a, the colpitts quadrature voltage controlled oscillator 400 of the present invention includes first and second LC resonators 401a and 401b connected to a power supply voltage $V_{cc}$ and generating a resonance frequency, first and second differential oscillators 402 and 403 including first and second oscillation transistors $Q_1$ and $Q_2$ that oscillate at the generated resonance frequency to output an oscillation signal, third and fourth differential oscillators 404 and 405 including fifth and sixth oscillation transistors $Q_5$ and $Q_6$ that oscillate at the resonance frequency generated from the second LC resonator 401b to output an oscillation signal, feedback capacitors $C_f$ and a degeneration capacitor $C_e$ respectively connected between the first and second oscillation transistors $Q_1$ and $Q_2$ and the [[firth]] fifth and sixth oscillation transistors $Q_5$ and $Q_s$, and current sources $I_s$.

The colpitts quadrature voltage controlled oscillator 400 of the present invention has a structure in which the third and fourth differential oscillators 404 and 405 including the fifth and sixth oscillation transistors $Q_5$ and $Q_6$ are respectively connected to the third and fourth output nodes Q+ and Q− of the second LC resonator 201 in the voltage controlled oscillator 200 of FIG. 2a, and orthogonal signals are generated from the collector and base terminals of the first and second oscillation transistors $Q_1$ and $Q_2$.

That is, in the voltage controlled oscillator 200 of FIG. 2a, the orthogonal signals of the first and second output nodes I+ and I− of the first LC resonator 201a are smaller than those of the third and fourth output nodes Q+ and Q− of the second LC resonator 201b, and thus the quadrature orthogonal signals do not have uniform amplitudes and thus are not exactly 90 degrees out of phase. To solve this problem, as illustrated in FIG. 4a, the collectors of the fifth and sixth oscillation transistors $Q_5$ and $Q_6$ are differentially cross-coupled to the first and second output nodes I+ and I− of the first LC resonator 401a, and the bases of the fifth and sixth oscillation transistors $Q_5$ and $Q_6$ are respectively connected to the third and fourth output nodes Q+ and Q− of the second LC resonator 401b.

Briefly describing the connection of the third and fourth differential oscillators 404 and 405, the feedback capacitors $C_f$ are respectively connected between the bases and the emitters of the fifth and sixth oscillation transistors $Q_5$ and $Q_6$, the degeneration capacitor $C_e$ is connected between the emitter of the fifth oscillation transistor $Q_5$ and the emitter of the sixth oscillation transistor $Q_6$, and the current sources $I_s$ are respectively connected between the emitters and the ground of the fifth and sixth oscillation transistors $Q_5$ and $Q_6$. Also, the collectors of the first and second oscillation transistors $Q_1$ and $Q_2$ are respectively connected to the third and fourth output nodes Q+ and Q− of the second LC resonator 401b, the base of the first oscillation transistor $Q_1$ is connected to the collector of the sixth oscillation transistor $Q_6$, and the base of the second oscillation transistor $Q_2$ is connected to the collector of the fifth oscillation transistor $Q_5$.

That is, the first output node I+ of the first LC resonator 401a is connected to both the base of the first oscillation transistor $Q_1$ and the collector of the sixth oscillation transistor $Q_6$, and the second output node I− is connected to both the base of the second oscillation transistor $Q_2$ and the collector of the fifth oscillation transistor $Q_5$. The third output node Q+ of the second LC resonator 401b is connected to both the collector of the first oscillation transistor $Q_1$ and the base of the fifth oscillation transistor $Q_5$, and the fourth output node Q− is connected to both the collector of the second oscillation transistor $Q_2$ and the base of the sixth oscillation transistor $Q_6$.

Briefly describing operation of the colpitts quadrature voltage controlled oscillator 400 having the above structure, first, values of the feedback capacitors $C_f$ and the degeneration capacitor $C_e$ are adjusted and generate a negative resistance in a desired frequency band so that the first LC resonator 401a and the second LC resonator 401b can resonate at a desired frequency.

The resonance frequency generated by the first LC resonator 401a is input to the bases of the first and second oscillation transistors $Q_1$ and $Q_2$ of the first and second differential oscillators 402 and 403 to induce oscillation, and the resonance frequency generated by the second LC resonator 401b is input to the bases of the fifth and sixth oscillation transistors $Q_5$ and $Q_6$ of the third and fourth differential oscillators 404 and 405 to induce oscillation.

Here, amplitudes of the orthogonal signals output from the bases of the first and second oscillation transistors $Q_1$ and $Q_2$ are increased by the high voltage swing widths of the collectors of the fifth and sixth oscillation transistors $Q_5$ and $Q_6$, and thus the amplitudes of the orthogonal signals output from the bases of the first and second oscillation transistors $Q_1$ and $Q_2$ become the same as those output from the collectors of the first and second oscillation transistors $Q_1$ and $Q_2$. That is, the amplitudes of the orthogonal signals from the first and second output nodes I+ and I− of the first LC resonator 401a are increased by the fifth and sixth oscillation transistors $Q_5$ and $Q_6$, so that they become the same as those from the third and fourth output nodes Q+ and Q− of the second LC resonator 401b.

As a result, quadrature orthogonal signals of the same amplitude are respectively output from the first to fourth output nodes I+, I−, Q+ and Q− that are respectively connected to the base and collector terminals of the first and second oscillation transistors $Q_1$ and $Q_2$ by the fifth and sixth oscillation transistors $Q_5$ and $Q_6$.

Figure 4B:
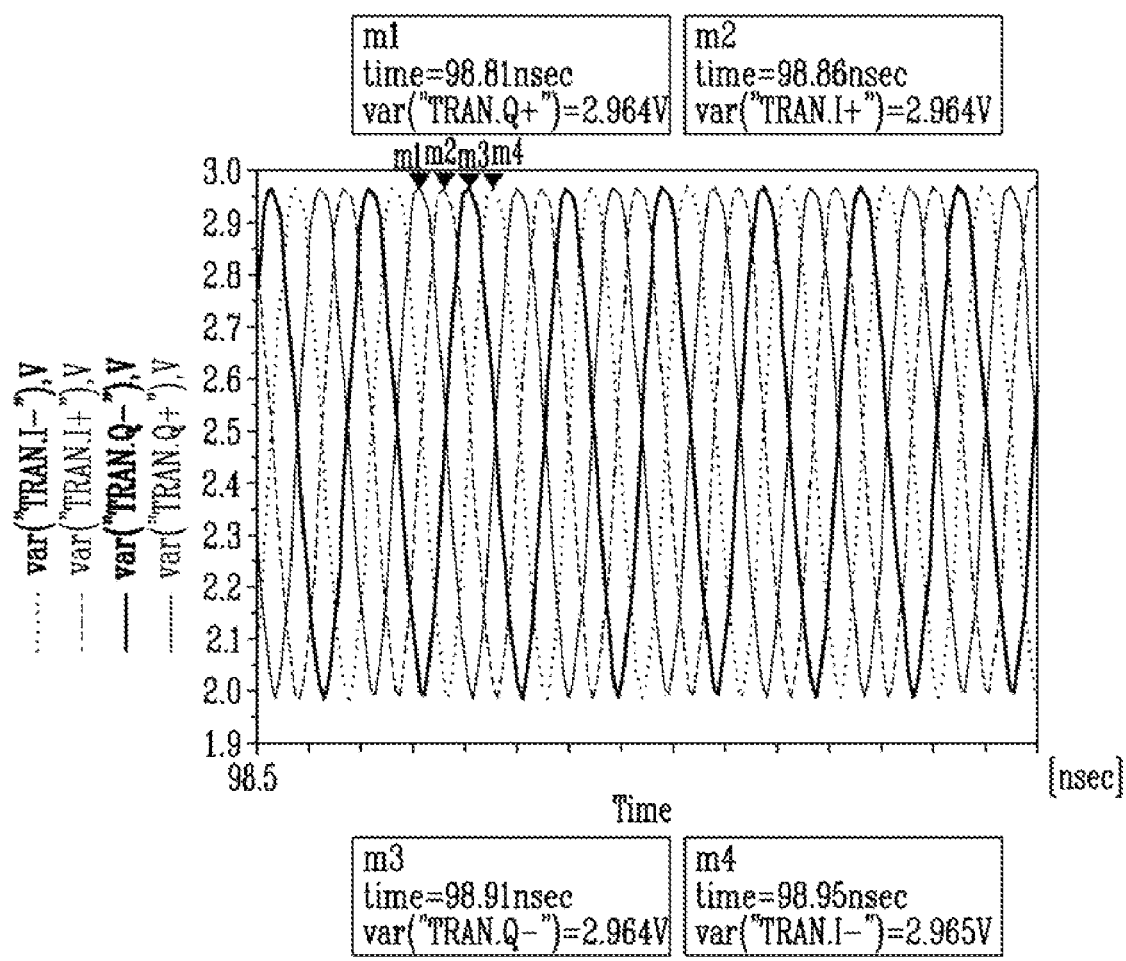

FIG. 4b illustrates an orthogonal signal output from the colpitts quadrature voltage controlled oscillator 400 of FIG. 4a. As illustrated in FIG. 4b, quadrature orthogonal signals that have the same amplitude and are precisely 90 degrees out of phase are generated from the first and second output nodes I+ and I− of the first LC resonator 401a and the third and fourth output nodes Q+ and Q− of the second LC resonator 401b.

Figure 4C:
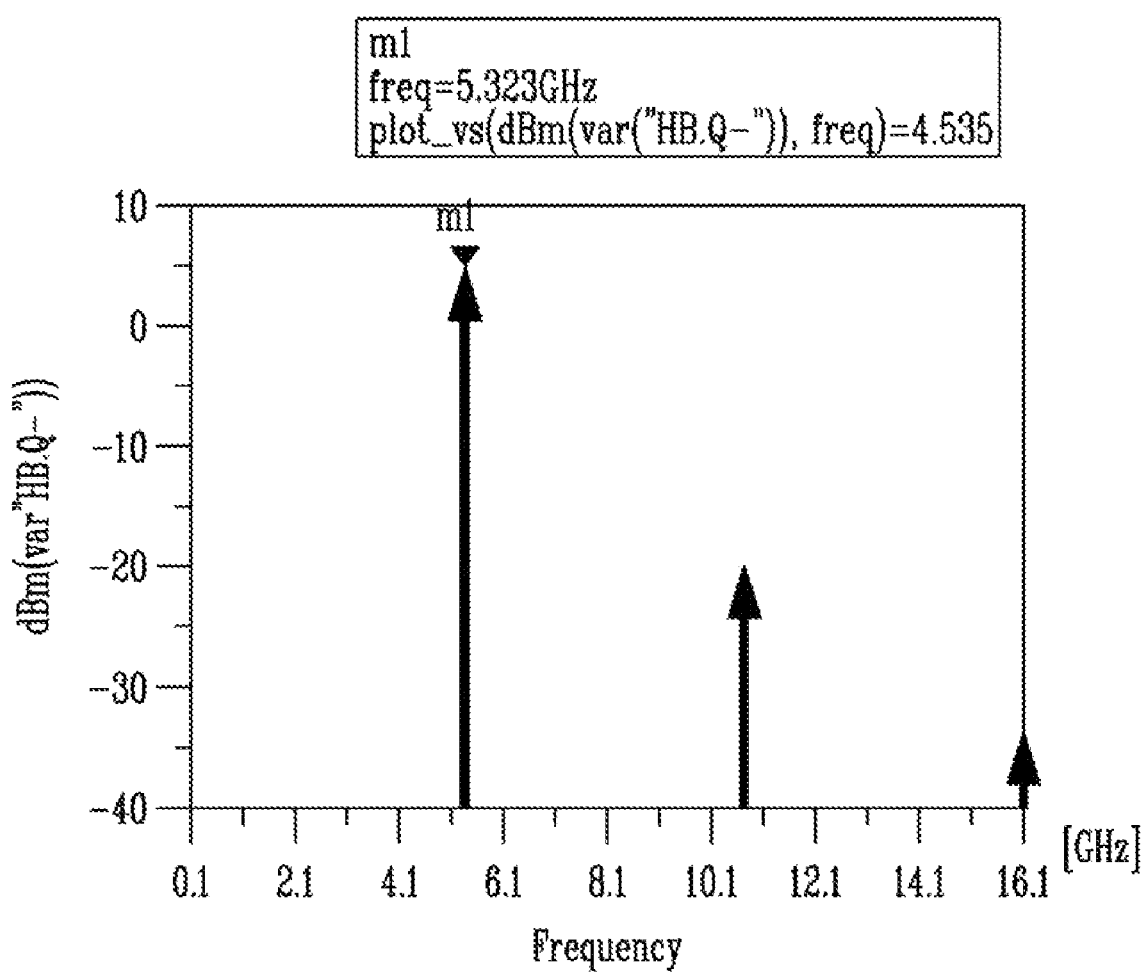

In addition, FIG. 4c illustrates a frequency spectrum of the orthogonal signal generated from the colpitts quadrature voltage controlled oscillator 400 of FIG. 4a. It was observed that the spectrum had excellent frequency characteristics exhibiting an output power of 4.5 dBm and a harmonic suppression of −25 dBc or lower.

As described above, according to a colpitts quadrature voltage controlled oscillator of the present invention, a precise quadrature orthogonal signal can be obtained without using a separate coupled device or a passive/active device.

As described above, according to the present invention, a precise quadrature orthogonal signal can be obtained without using an additional circuit such as a coupled transistor, a coupled transformer, a multiphase RC filter, etc. Thus, non-linearity, increased phase noise, a decrease in the Q− factor of an LC resonator, and increased power consumption can be avoided. Therefore, a colpitts quadrature voltage controlled oscillator that exhibits low phase noise, reduced power consumption, and has a compact size can be implemented.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A colpitts quadrature voltage controlled oscillator comprising:
    first and second LC resonators connected to a power supply voltage and generating a same resonance frequency, each resonator comprising a coupling capacitor and two inductors respectively having first and second ends, the two inductors being connected to each other at the first ends thereof and connected at the second ends thereof to opposing ends of the coupling capacitor;

first and second differential oscillators respectively comprising first and second oscillation transistors that oscillate at the generated same resonance frequency to output an oscillation signal;

feedback capacitors and a degeneration capacitor connected between the first and second oscillation transistors; and a negative resistance cell for amplifying amplitudes of orthogonal signals generated from bases of the first and second oscillation transistors so that the amplitudes of the orthogonal signals generated from the bases of the first and second oscillation transistors become the same as amplitudes of orthogonal signals generated from collectors of the first and second oscillation transistors, wherein first and second output nodes of the first LC resonator are respectively connected to the bases of the first and second oscillation transistors, and third and fourth output nodes of the second LC resonator are respectively connected to the collectors of the first and second oscillation transistors, so that quadrature orthogonal signals having a phase difference of 90 degrees are generated from the bases and collectors of the first and second oscillation transistors, wherein the negative resistance cell comprises third and fourth transistors differentially cross-coupled to the first and second output nodes of the first LC resonator.

2. The oscillator of claim 1, wherein the feedback capacitors are respectively connected between the bases and emitters of the first and second oscillation transistors, the degeneration capacitor is connected between the emitter of the first oscillation transistor and the emitter of the second oscillation transistor, and current sources are respectively connected between the emitters and ground of the first and second oscillation transistors.

3. The oscillator of claim 1, wherein the same resonance frequency varies depending on values of the feedback capacitor and the degeneration capacitor.

4. The oscillator of claim 1, wherein the first output node of the first LC resonator is connected to both the base of the first oscillation transistor and a collector of the third transistor, and the second output node of the first LC resonator is connected to both the base of the second oscillation transistor and a collector of the fourth transistor.

5. The oscillator of claim 1, wherein a capacitor is connected between the emitters of the third and fourth transistors, and current sources are respectively connected to the emitters and ground of the third and fourth transistors.

6. The oscillator of claim 1, wherein the amplitudes of the orthogonal signals generated from the bases of the first and second oscillation transistors are increased by voltage swing widths of the collectors of the third and fourth transistors, so that the amplitudes of the orthogonal signals generated from the bases of the first and second oscillation transistors become the same as those generated from the collectors of the first and second oscillation transistors.

* * * * *